(12) United States Patent
Smith et al.

(10) Patent No.: US 9,608,112 B2
(45) Date of Patent: Mar. 28, 2017

(54) BULEX CONTACTS IN ADVANCED FDSOI TECHNIQUES

(71) Applicant: GLOBALFOUNDRIES Inc., Grand Cayman (KY)

(72) Inventors: Elliot John Smith, Dresden (DE); Sven Beyer, Dresden (DE); Tom Hasche, Dresden (DE); Jan Hoentschel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/816,337

(22) Filed: Aug. 3, 2015

(65) Prior Publication Data

US 2017/0040450 A1 Feb. 9, 2017

(51) Int. Cl.

| | |
|---|---|
| *H01L 27/01* | (2006.01) |
| *H01L 29/78* | (2006.01) |
| *H01L 29/08* | (2006.01) |
| *H01L 29/06* | (2006.01) |
| *H01L 27/06* | (2006.01) |
| *H01L 27/12* | (2006.01) |
| *H01L 29/66* | (2006.01) |

(52) U.S. Cl.
CPC ...... *H01L 29/7843* (2013.01); *H01L 27/0629* (2013.01); *H01L 27/1203* (2013.01); *H01L 29/0653* (2013.01); *H01L 29/0847* (2013.01); *H01L 29/66537* (2013.01); *H01L 29/7838* (2013.01)

(58) Field of Classification Search
CPC ..... H01L 21/823807; H01L 2924/0002; H01L 29/665; H01L 29/7833; H01L 21/823814; H01L 29/66545; H01L 29/6656; H01L 29/6659; H01L 29/66636; H01L 21/823412; H01L 29/165; H01L 29/7848; H01L 2924/00

See application file for complete search history.

(56) References Cited

U.S. PATENT DOCUMENTS

| | | | |
|---|---|---|---|
| 9,023,688 B1 | 5/2015 | Or-Bach et al. | |
| 9,257,530 B1* | 2/2016 | Zschatzsch | ....... H01L 29/66545 |
| 2004/0242010 A1* | 12/2004 | Deshpande | ......... H01L 21/3185 438/710 |
| 2005/0242398 A1 | 11/2005 | Chen et al. | |
| 2006/0208339 A1 | 9/2006 | Iioka et al. | |

(Continued)

OTHER PUBLICATIONS

Office Action from related U.S. Appl. No. 15/042,547 dated Nov. 21, 2016.

*Primary Examiner* — Robert Bachner
(74) *Attorney, Agent, or Firm* — Amerson Law Firm, PLLC (57) ABSTRACT

The present disclosure provides, in accordance with some illustrative embodiments, a method of forming a semiconductor device, the method including providing an SOI substrate with an active semiconductor layer disposed on a buried insulating material layer, which is in turn formed on a base substrate material, forming a gate structure on the active semiconductor layer in an active region of the SOI substrate, partially exposing the base substrate for forming at least one bulk exposed region after the gate structure is formed, and forming a contact structure for contacting the at least one bulk exposed region.

18 Claims, 11 Drawing Sheets

(56) References Cited

U.S. PATENT DOCUMENTS

| | | | |
|---|---|---|---|
| 2008/0099811 A1* | 5/2008 | Tak | H01L 27/108 |
| | | | 257/297 |
| 2009/0242953 A1* | 10/2009 | Booth, Jr. | H01L 27/0629 |
| | | | 257/301 |
| 2012/0302023 A1* | 11/2012 | Javorka | H01L 29/7781 |
| | | | 438/285 |
| 2013/0146953 A1* | 6/2013 | Cheng | H01L 21/84 |
| | | | 257/296 |
| 2014/0103436 A1 | 4/2014 | Bedell et al. | |

* cited by examiner

BULEX CONTACTS IN ADVANCED FDSOI TECHNIQUES

BACKGROUND OF THE INVENTION

1. Field of the Invention

The present disclosure generally relates to advanced FDSOI techniques and, more particularly, to the fabrication of BULEX contacts in advanced FDSOI techniques.

2. Description of the Related Art

In the ongoing task to comply with constraints imposed by Moore's Law, FDSOI ("fully depleted silicon-on-insulator") is currently favored as the basis for next generation technologies in the fabrication of semiconductor devices at technology nodes of 22 nm and beyond. Aside from FDSOI allowing the combination of high performance and low power consumption, complemented by an excellent responsiveness to power management design techniques, fabrication processes as employed in FDSOI techniques are comparatively simple and actually represent a low risk evolution of conventional planar bulk CMOS techniques when compared to three-dimensional transistor designs, such as FinFETs.

In general, silicon-on-insulator (SOI) techniques make use of a special kind of substrate being formed by a semiconductor layer, such as silicon, germanium or silicon germanium, formed on a buried oxide (BOX) layer, which is in turn formed on a semiconductor substrate. Conventionally, there are two types of SOI devices: PDSOI (partially depleted SOI) and FDSOI MOSFETs (fully depleted SOI). For example, in an N-type PDSOI MOSFET, a P-type film is sandwiched between a gate oxide (GOX) and the BOX, where a thickness of the P-type film is such that the depletion region cannot cover the whole P-region. Therefore, to some extent, PDSOI devices may behave like bulk MOSFETs.

In FDSOI substrates, the thickness of the semiconductor layer is such that the depletion region covers the whole semiconductor layer. Herein, the GOX in FDSOI techniques supports fewer depletion charges than a bulk substrate and an increase in the inversion charges occurs in the fully depleted semiconductor layer, resulting in higher switching speeds.

In recent attempts to provide a simple way of meeting power/performance targets, back biasing was suggested for FDSOI devices. When adopting the concept of back biasing, a voltage is applied just under the BOX of target semiconductor devices. In doing so, the electrostatic control of the semiconductor device is changed and the threshold voltage is shifted to either obtain more drive current (hence, higher performance) at the expense of increased leakage current (forward back bias, FBB) or to cut leakage current at the expense of reduced performance. While back bias in planar FDSOI techniques is somewhat similar to body bias as implemented in bulk CMOS technologies, it offers a number of key advantages in terms of level and efficiency of the bias that can be applied. For example, back biasing can be utilized in a dynamic way on a block-by-block basis. It can be used to boost performance during the limited periods of time when maximum peak performance is required from that block. It can also be used to cut leakage during the periods of time when limited performance is not an issue.

The effects of process and temperature variations can be reduced when using back biasing techniques are employed. As a result, the design of circuits including such devices becomes much easier by greatly reducing the spread of performance that the designers have to address when designing a circuit. As back biasing further allows operation at consistently lower (and more constant) supply voltages, the power consumption of FDSOI devices is also reduced and electromigration and power density problems are eased.

The implementation of back bias in the setup of FDSOI techniques involves a local exposure of the bulk substrate, so-called BULEX ('bulk exposed') regions, that are to be contacted. Naturally, the bulk substrate has a height difference relative to an upper surface of the active semiconductor layer of an SOI substrate. Accordingly, a step height exists between BULEX regions and SOI substrates in the form of the BOX layer and the active semiconductor layer. In advanced technologies, the step height may be on the order of 30 nm, which raises big challenges in front end of line (FEOL) processing of advanced semiconductor devices. For example, the step height between the bulk semiconductor material (at the BULEX regions) and the upper surface of the active layer of an SOI substrate (at transistor devices) leads to uncontrollable variations in the critical dimensions, to large offsets between FDSOI and bulk structure critical dimensions and, particularly, in lithographical processes, to divots and crevices where film residues are hard to remove and which can cause shorts and leaks in the final circuit.

One conventional fabrication process for forming BULEX contacts besides SOI semiconductor devices will be explained with regard to FIGS. 1a-1d and 2a-2c below.

FIGS. 1a-1d schematically show, in a cross-sectional view, a known FEOL process for implementing a back bias contact via contacting a BULEX area beside an active region according to SOI techniques. With regard to FIG. 1a, a known SOI substrate region is schematically illustrated. As indicated above, an SOI substrate is formed by a base substrate material 101, on which a buried oxide (BOX) material 103, and an active silicon film 105 is provided.

Figure 1A:
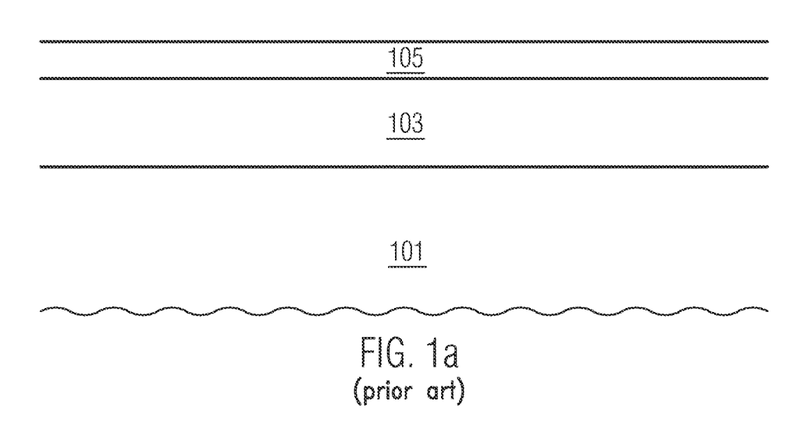
FIGS. 1a-1d schematically illustrate, in a cross-sectional view, a fabrication process for forming a BULEX region in SOI techniques in accordance with a first known technique.
Figure 1B:
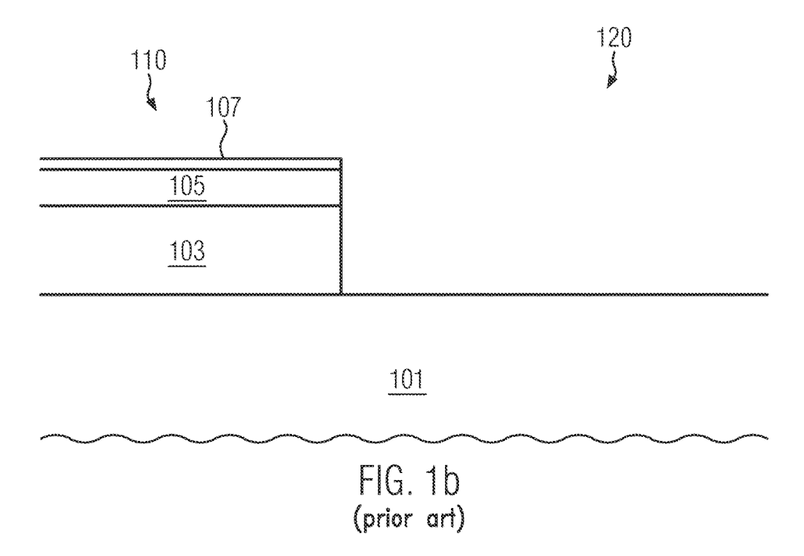

Starting from the SOI substrate as schematically illustrated in FIG. 1a, a bulk exposed region 120 is formed adjacent to an SOI region 110 by techniques implemented for locally removing the BOX material 103 and the active silicon film 105, as shown in FIG. 1b. Herein, a mask pattern (not illustrated) may be formed via lithographical techniques, e.g., by forming a resist material (not illustrated) on a thin oxide liner 107 (passivation oxide) provided on the active silicon film 105 and lithographically patterning the resist material (not illustrated) such that a region, where the BULEX region 120 is to be provided, is not covered by the masking pattern (not illustrated). In removing the active silicon film 105 and the BOX material 103 in accordance with the masking pattern (not illustrated), a bulk exposed region 120 is locally formed.

Figure 1C:
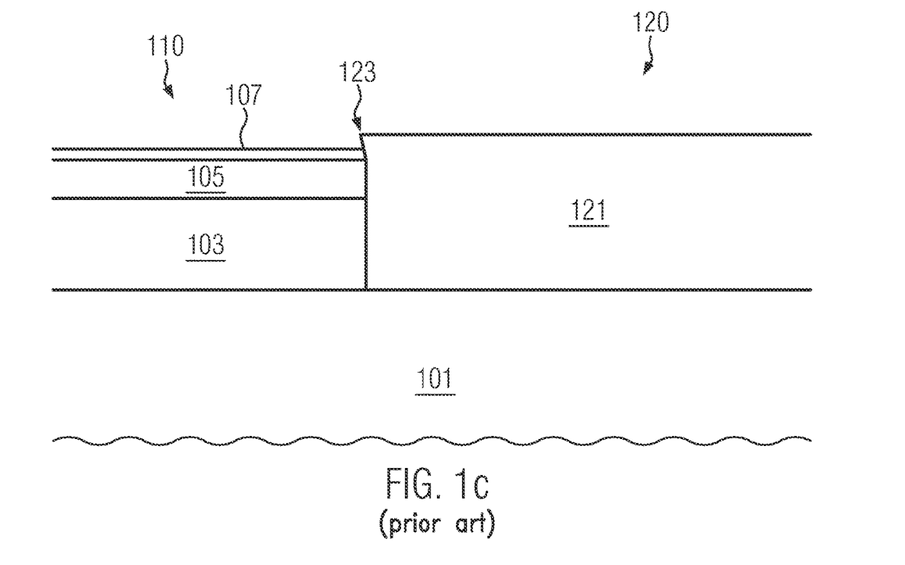

Regarding FIG. 1c, a process of re-growing silicon material on the BULEX region 120 is preformed such that the step height between the BULEX region 120 and the active silicon film 105 in the SOI region 110 is reduced. However, as the height level of the re-grown silicon material 121 on the BULEX region 120 may not totally match the height level of the active silicon film 105, the re-grown silicon material 121 is overgrown and, as a consequence, a dislocation portion 123 is formed at the interface of the SOI region 110 and the BULEX region 120.

Figure 1D:
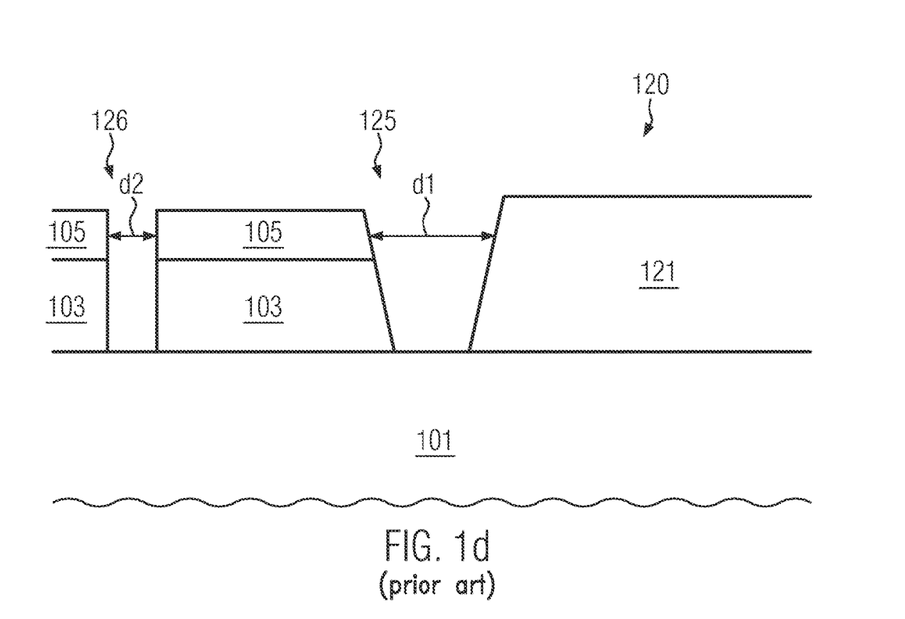

In order to avoid possible disadvantageous effects resulting from the dislocation 123, a shallow trench isolation (STI) region of sufficient width is formed at the interface by matching a trench 125 with a width dimension d1 into the SOI material and the re-grown silicon material 121 at the interface between the SOI region 110 and the BULEX region 120, as shown in FIG. 1d. Therefore, a separation between the BULEX region 120 and the SOI region 110 has to be implemented in order to remove the dislocation 123, therefore leading to an increased distance between a BULEX contact (not illustrated), which is to be formed on the BULEX region 120, relative to a semiconductor device (not illustrated), which is to be formed on and in the SOI region 110 during subsequent fabrication steps. Conventionally, a width of the trench 125 is greater than a width of normally formed STI trenches 126, i.e., d1>d2.

Figure 2A:
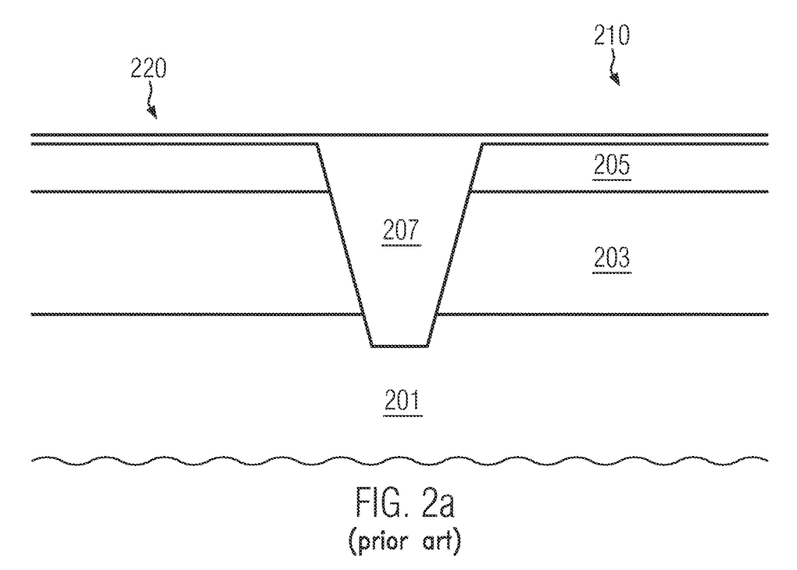
FIGS. 2a-2c schematically illustrate, in a cross-sectional view, a fabrication process for providing a BULEX region in SOI techniques in accordance with a second known technique.
Figure 2B:
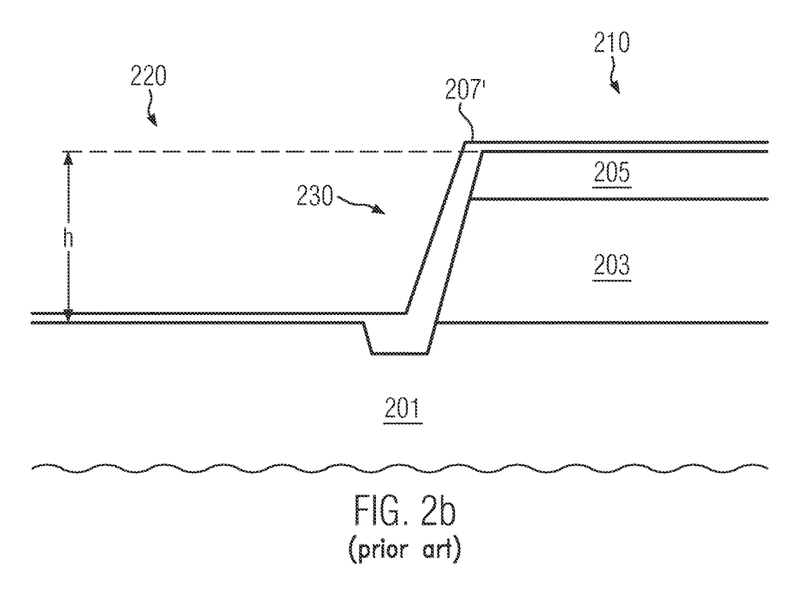
Figure 2C:
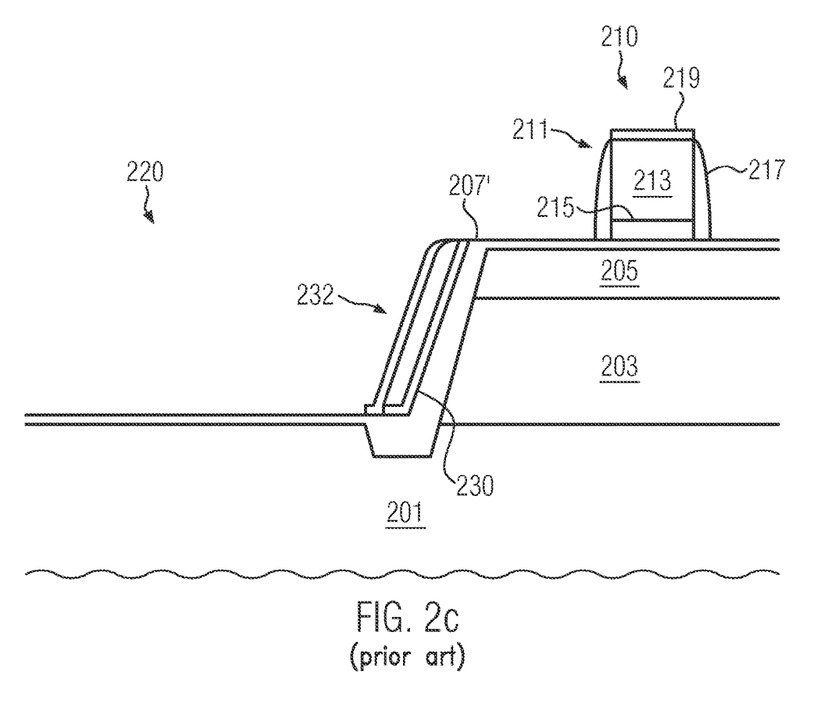

With regard to FIGS. 2a-2c, issues appearing with the step height difference between BULEX regions and SOI regions are illustrated. FIG. 2a schematically illustrates a semiconductor device structure at an early stage during fabrication, particularly before any gate structure is formed and an STI region 207 is provided within an SOI substrate structure (base substrate 201, BOX material 203 and active silicon film 205), where the STI structure 207 separates a first SOI region 210 and a second SOI region 220. The first SOI region 210 and the second SOI region 220 are herein covered by a thin oxide liner.

Subsequently, a BULEX region is formed in the second SOI region 220 by locally removing the BOX material 203 and the active silicon film 205 in the second SOI region 220. Accordingly, a step height h (see FIG. 2b) is provided between the BULEX region 220 and the SOI region 210. As the STI 207 is partially exposed when the BOX material 203 and the active silicon film 205 in the bulk exposed (BULEX) region 220 are removed, a step 230 is formed in the STI 207 resulting in a stepped STI structure 207'.

Subsequent to providing the BULEX region 220, a gate structure 211 is formed on the SOI region 210, as shown in FIG. 2c. The gate structure 211 is formed by depositing a gate dielectric material 215 and a gate electrode material 213 over the SOI region 210 and the BULEX region 220, forming a gate mask pattern (not illustrated) on the deposited materials and removing the deposited material in accordance with the gate mask pattern (not illustrated). After the gate stack 213, 215 is patterned, sidewall spacers 217 and the gate cap 219 are formed by depositing the spacer forming material and anisotropically etching the spacer forming material.

As a result of the gate stack patterning (herein, the anisotropic etching of the gate material) and the spacer forming process (herein, the anisotropic etching of the spacer forming material), residual material 232 of the gate stack and the spacer remains at the step 230 in the stepped STI structure 207'. The residual material 232 leads to a large BULEX-to-SOI distance and could possibly induce an undesired conducting structure at the stepped STI structure 207'.

In view of the above-described situation, it is desirable to provide a BULEX contact in FDSOI techniques without the issues as discussed above with regard to FIGS. 1a-2c.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In a first aspect of the present disclosure, a method of forming a semiconductor device is provided. In accordance with some illustrative embodiments herein, the method includes providing an SOI substrate with an active semiconductor layer disposed on a buried insulating material layer, which is in turn formed on a base substrate material, forming a gate structure on the active semiconductor layer in an active region of the SOI substrate, partially exposing the base substrate for forming at least one bulk exposed region after the gate structure is formed, and forming a contact structure for contacting the at least one bulk exposed region.

In accordance with a second aspect of the present disclosure, a method of forming a semiconductor device is provided. In accordance with some illustrative embodiments herein, the method includes providing an SOI substrate with an active semiconductor layer disposed on a buried insulating material layer, which is in turn formed on a base substrate material, forming an STI structure separating a first SOI region and a second SOI region, forming a gate structure on the active semiconductor layer in the first SOI region, and forming a diode structure in the second SOI region after the gate structure is formed.

In a third aspect of the present disclosure, a method of forming a semiconductor device is provided. In accordance with some illustrative embodiments herein, the method includes providing an SOI substrate with an active semiconductor layer disposed on a buried insulating material layer, which is in turn formed on a base substrate material, forming an STI structure separating a first SOI region and a second SOI region, forming a gate structure on the active semiconductor layer in the first SOI region, and partially exposing the bulk substrate in the first SOI region at one side of the gate structure and contacting the exposed bulk region in the first SOI region for forming a back bias contact for the gate structure in the first SOI region.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The present disclosure relates to a method of forming a semiconductor device and to semiconductor devices, wherein the semiconductor devices are integrated on or in a chip. In accordance with some illustrative embodiments of the present disclosure, the semiconductor devices may substantially represent FETs, e.g., MOSFETs or MOS devices. When referring to MOS devices, the person skilled in the art will appreciate that, although the expression "MOS device" is used, no limitation to a metal-containing gate material and/or to an oxide-containing gate dielectric material is intended.

Semiconductor devices of the present disclosure concern devices which may be fabricated by using advanced technologies, i.e., the semiconductor devices may be fabricated by technologies applied to approach technology nodes smaller than 100 nm, for example, smaller than 50 nm or smaller than 35 nm, e.g., at 28 nm or below. After a complete reading of the present application, a person skilled in the art will appreciate that, according to the present disclosure, ground rules smaller or equal to 45 nm, e.g., at 28 nm or below, may be imposed. The present disclosure proposes semiconductor devices that may have structures of minimal length dimensions and/or width dimensions smaller than 100 nm, for example, smaller than 50 nm or smaller than 35 nm or smaller than 28 nm. For example, the present disclosure may provide semiconductor devices fabricated by using 45 nm technologies or below, e.g., 28 nm or even below.

The semiconductor devices disclosed herein may be fabricated as P-channel MOS transistors or PMOS transistors and N-channel transistors or NMOS transistors; both types of transistors may be fabricated with or without mobility-enhancing stressor features or strain-inducing features. It is noted that a circuit designer can mix and match device types, using PMOS and NMOS devices, stressed and unstressed, to take advantage of the best characteristics of each device type as they best suit the semiconductor device under design.

In general, SOI devices have an active semiconductor layer disposed on a buried insulating material layer, which, in turn, is formed on a base substrate material. In accordance with some illustrative embodiments herein, the active semiconductor layer may comprise one of silicon, germanium, silicon germanium and the like. The buried insulating material layer may comprise an insulating material, e.g., silicon oxide or silicon nitride. The base substrate material may be a base material that may be used as a substrate as known in the art, e.g., silicon and the like. In accordance with illustrative embodiments employing FDSOI substrates disclosed herein, the active semiconductor layer may have a thickness of about 20 nm or less, while the buried insulating material layer may have a thickness of about 145 nm or, in accordance with advanced techniques, the buried insulating material layer may have a thickness in a range from about 10 to about 30 nm. For example, in some special illustrative embodiments of the present disclosure, the active semiconductor layer may have a thickness of about 3 to about 10 nm.

As to a crystalline plane orientation of the base substrate material, similar to that of an ordinary silicon device, an SOI substrate whose surface is a face (100) may be used. However, in order to improve the performance of a PMOS semiconductor device, a surface of the PMOS semiconductor device may be used as a face (110). Alternatively, a hybrid plane orientation substrate whose surface may be mixed by a face (100) and a face (110) may be used. With regard to a varactor device, there is no restriction on a crystal plane orientation such that an impurity concentration, film thickness, dimension ratio of the device, and the like can be appropriately adjusted to obtain a capacitance characteristic that is suitable according to the plane orientation set by other requirements. In alternative embodiments, the base substrate material may be of an N-type when N-accumulation and/or N-inversion devices are considered (otherwise P-type for P-accumulation and/or P-inversion).

In accordance with one illustrative embodiment of the present disclosure, as described above, a semiconductor device may be formed by providing an SOI substrate with an active semiconductor layer disposed on a buried insulating material layer, which is in turn formed on a base substrate material, forming a gate structure above the active semiconductor layer in an active region of the SOI substrate, partially exposing the base substrate for forming at least one bulk exposed region after the gate structure is formed, and forming a contact structure for contacting the at least one bulk exposed region. In accordance with some illustrative embodiments herein, a well implantation process may be performed prior to forming the contact structure for implanting dopants into the bulk exposed region so as to form bulk well regions. In accordance with yet another example disclosed herein, an STI structure may be further provided in the SOI substrate prior to forming the gate structure and forming two bulk exposed regions, wherein the bulk exposed regions and the active region are separated by the STI structure. For example, a diode structure may be formed upon forming a contact structure contacting the bulk exposed regions.

In accordance with some illustrative embodiments disclosed herein, a well implantation process may be performed prior to forming the contact structure for implanting dopants into the bulk exposed region so as to form bulk well regions, wherein the bulk exposed region is provided in the active region and a silicide contact is formed in the bulk well regions. The silicide contact may be subsequently contacted by the contact structure for forming a back bias contact for the gate structure. In accordance with one illustrative embodiment, raised source/drain regions (RSD) may be formed adjacent to the gate structure in the active region before exposing the base substrate, wherein the bulk exposed region is formed by etching a trench into the RSD region at one side of the gate structure so as to expose the bulk substrate in the trench.

In accordance with other illustrative embodiments, germanium may be implanted into the active semiconductor layer of the active region for forming a silicon-germanium region in the active semiconductor layer prior to forming the gate structure.

In accordance with yet other illustrative embodiments, the base substrate may be exposed by etching a trench into the active semiconductor layer and the buried insulating material layer. In one illustrative embodiment depicted herein, the contact structure may be formed by forming a PEN liner in the trench and depositing a contact material in the trench in alignment with the PEN liner. For example, a silicide region may be formed in the bulk exposed region, before the PEN liner is formed.

In accordance with yet another illustrative embodiment of the present disclosure, as described above, a semiconductor device may be formed by providing an SOI substrate with an active semiconductor layer disposed on a buried insulating material layer, which is in turn formed on a base substrate material, forming an STI structure separating a first SOI region and a second SOI region, forming a gate structure on the active semiconductor layer in the first SOI region, and forming a diode structure in the second SOI region after the gate structure is formed.

In accordance with some illustrative embodiments, the diode structure may be formed by etching a first trench and a second trench into the second SOI region, wherein each trench exposes the base substrate such that a first bulk exposed region and a second bulk exposed region are provided in the second SOI region, implanting well regions into the first and second bulk exposed regions for forming bulk well regions, and forming a contact structure contacting the bulk well regions.

In accordance with still other illustrative embodiments, the bulk substrate may be partially exposed in the first SOI region at one side of the gate structure and the exposed bulk region in the first SOI region may be contacted for forming a back bias contact for the gate structure in the first SOI region. In one illustrative embodiment herein, a raised source/drain region may be formed at both sides of the gate structure, before the bulk exposed regions are formed in the first and second SOI regions, and the raised source/drain region may be removed at the one side of the gate structure, when the exposed bulk region is formed in the first region. For example, the raised source/drain region may be removed by etching a trench into the raised source/drain region at the one side of the gate structure, followed by forming a PEN liner in the trench and depositing a contact material in the trench in alignment with the PEN liner for forming a back bias contact in the trench.

In accordance with yet another embodiment of the present disclosure, as described above, a semiconductor device may be formed by providing an SOI substrate with an active semiconductor layer disposed on a buried insulating material layer, which is in turn formed on a base substrate material, forming an STI structure separating a first SOI region and a second SOI region, forming a gate structure on the active semiconductor layer in the first SOI region, and partially exposing the bulk substrate in the first SOI region at one side of the gate structure and contacting the exposed bulk region in the first SOI region for forming a back bias contact for the gate structure in the first SOI region.

In accordance with some illustrative embodiments, a raised source/drain region may be formed at both sides of the gate structure on the first SOI region prior to forming the bulk exposed regions, and the raised source/drain region may be partially removed at the one side of the gate structure, when the exposed bulk region is formed in the first region. In one illustrative embodiment herein, the raised source/drain region may be removed by etching a trench into the raised source/drain region at the one side of the gate structure, followed by forming a PEN liner in the trench and depositing a contact material in the trench in alignment with the PEN liner for forming a back bias contact in the trench.

In accordance with some illustrative embodiments, a diode structure may be formed in the second SOI region by etching a first trench and a second trench into the second SOI region, each trench exposing the base substrate such that a first bulk exposed region and a second bulk exposed region are provided in the second SOI region, implanting well regions into the first and second bulk exposed regions for forming bulk well regions, and forming a contact structure contacting the bulk well regions.

Further illustrative embodiments will be apparent from the description of FIGS. 3a to 3n below.

Figure 3A:
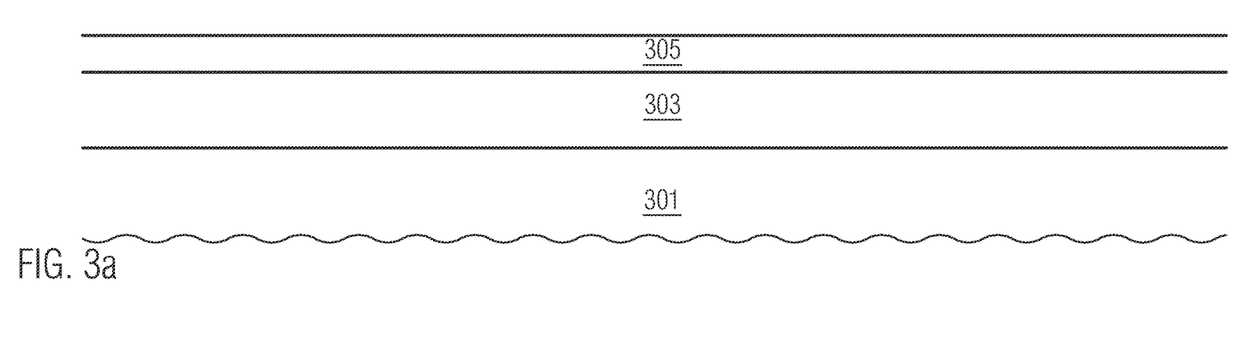
FIGS. 3a-3n schematically illustrate, in cross-sectional views, a process for fabricating contacts to BULEX regions in SOI techniques in accordance with various illustrative embodiments of the present disclosure.

FIG. 3a schematically illustrates a semiconductor device structure at an early stage during fabrication, particularly at a stage when an SOI substrate is provided. The SOI substrate is formed by an active semiconductor layer 305 provided on a buried insulating material layer 303, which is, in turn, disposed on a base semiconductor material 301. In accordance with some illustrative examples of the present disclosure, the active semiconductor layer 305 may be a semiconductor material such as silicon, silicon germanium, or the like. Furthermore, the buried insulating material layer 303 may be provided by an oxide material or a nitride material. The base substrate material 301 may be formed by silicon or any other appropriate semiconductor material. In accordance with some illustrative examples, the active semiconductor material 305 may have a thickness in a range from about 3-10 nm, while the buried insulating material 303 may have a thickness in a range from about 10-30 nm, or in a range from about 130-160 nm, e.g., at about 149 nm.

In accordance with some illustrative embodiments, the base semiconductor material 301 may be doped or undoped. For example, the base semiconductor material 301 may be P-doped or N-doped.

Figure 3B:
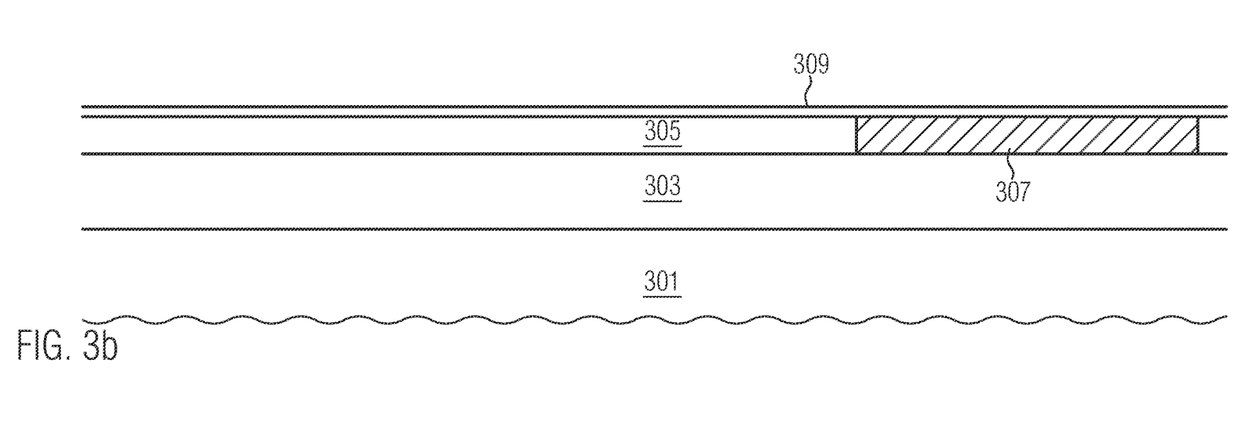

FIG. 3b schematically illustrates the semiconductor device structure at a more advanced stage during fabrication, particularly after a silicon germanium region 307 is provided in the active semiconductor layer 305, and a thin oxide layer 309 is formed over the semiconductor device structure.

In accordance with illustrative embodiments of the present disclosure, the silicon germanium region 307 may be provided by locally removing the active semiconductor layer 305, e.g., by means of an appropriate masking pattern (not illustrated), and epitaxially growing silicon germanium material in accordance with the masking pattern. Alternatively, a germanium layer may be formed on a portion of the active semiconductor material layer 305 and germanium material is subsequently diffused into the active semiconductor material layer 305 below the germanium layer by means of an appropriate annealing process. Still alternatively, germanium material may be implanted into the silicon germanium region 307 by means of an appropriate masking pattern (not illustrated).

Figure 3C:
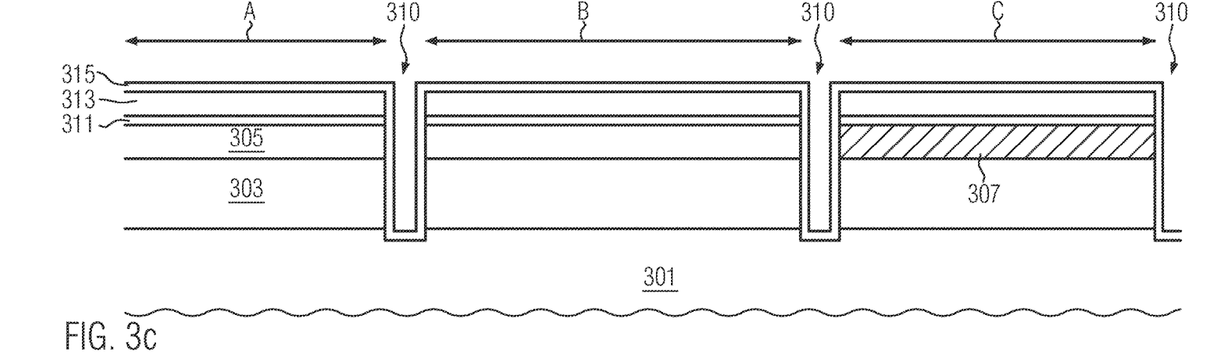

With regard to FIG. 3c, the semiconductor device structure is schematically illustrated at a more advanced stage during fabrication, particularly during a fabrication process for forming STI structures. At the stage illustrated in FIG. 3c, trenches 310 defining and separating SOI regions A, B and C are etched into the SOI substrate in accordance with appropriate masking patterns (not illustrated). The trenches 310 are etched into the active semiconductor material 305 and the buried insulating material 303 so as to stop at an upper surface region of the base substrate material 301. Subsequently, a thin oxide liner 315 may be deposited over the semiconductor device structure.

In accordance with some illustrative embodiments of the present disclosure, the trenches 310 may be formed by depositing a pad oxide 311 and a nitride material 313 on the semiconductor device structure as illustrated in FIG. 3b, followed by a resist material (not illustrated) which is then subjected to a lithographical process for patterning the resist material (not illustrated). In selectively etching the nitride material, oxide material, material of the active semiconductor material layer 305, and the buried insulating material layer 303 in one or more etching steps, the trenches 310 are formed. Afterwards, the resist material is removed and a passivating oxide liner 315 is formed.

Figure 3D:
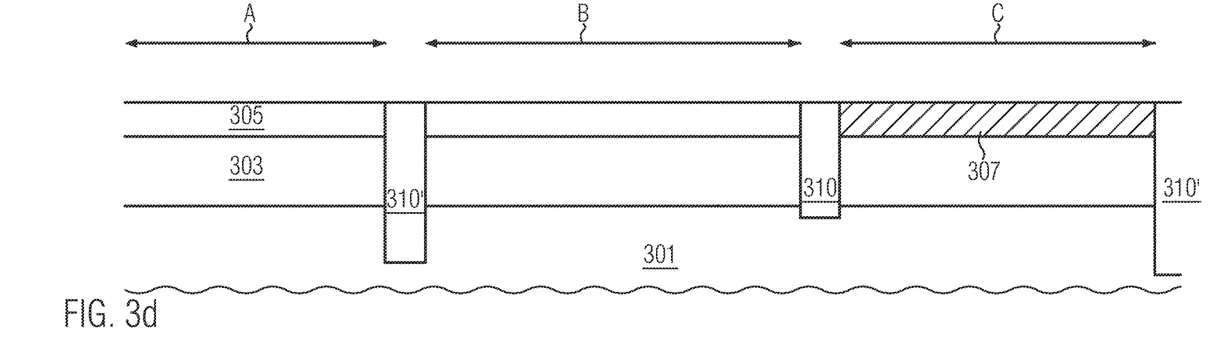

With regard to FIG. 3d, the semiconductor device structure is schematically illustrated at a more advanced stage during fabrication, particularly after a deep STI structure 310' is formed in addition to the shallow STI structure 310 and the trenches are filled, followed by a polishing process, e.g., CMP, removing the layers 311 to 315 and exposing upper surfaces of the active semiconductor material layer 305 in the SOI regions A, B and C.

Figure 3E:
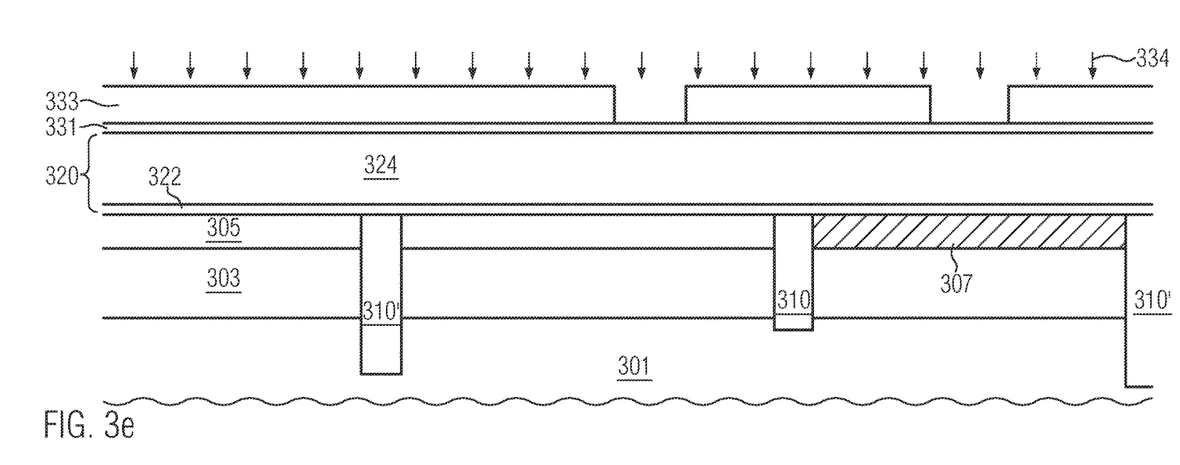

FIG. 3e schematically illustrates the semiconductor device structure at a more advanced stage during fabrication, particularly after gate materials 320, e.g., gate dielectric material 322 and gate electrode material 324, are deposited over the SOI regions A, B and C. In accordance with some illustrative embodiments of the present disclosure, at least one of a silicon oxide material and a high-k material (e.g. hafnium oxide and the like) is deposited when depositing the gate dielectric and metal gate material 322, followed by depositing one of amorphous silicon, polysilicon and an appropriate gate electrode metal as the gate electrode material 324.

Figure 3F:
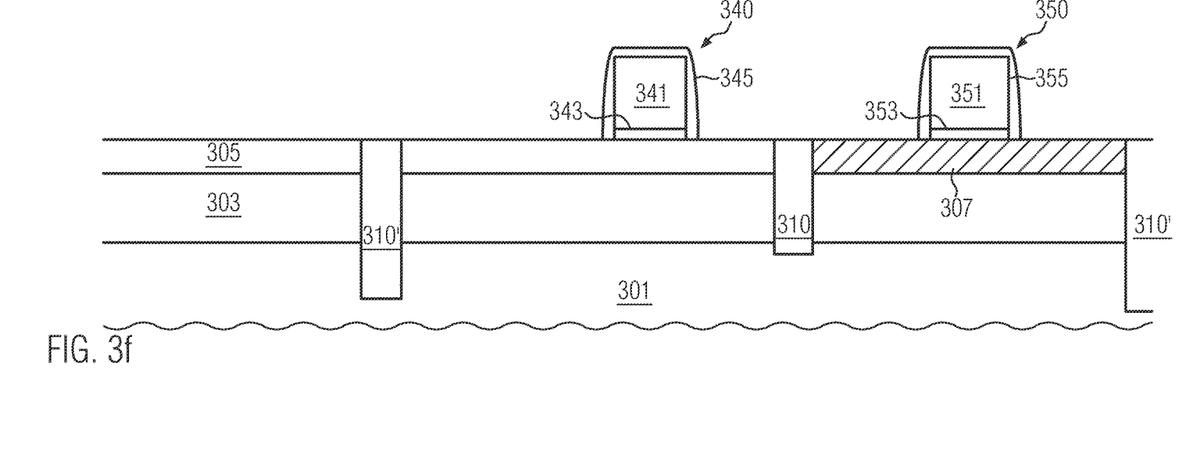

Next, a masking structure is formed over the semiconductor device structure, e.g., a hard mask formed by a nitride, oxide, or nitride/oxide stack material 331 and a patterned resist material 333. After performing a gate structuring process 334 by anisotropically etching the deposited gate material 320 via the masking pattern 331, 333, gate structures 340, 350 (schematically illustrated in FIG. 3O are formed in the SOI regions B and C. The person skilled in the art will appreciate that the gate structures 340, 350 are obtained after spacer structures 345, 355 are formed at the respective gate stacks 341, 343 and 351, 353. Particularly, the gate stacks 341, 343 and 351, 353 are formed, when the process 334 is completed and the mask 331, 333 is removed.

Next, after completing the process 334, a spacer forming material layer (not illustrated) is deposited over the semiconductor device structure, e.g., by blanket-deposition processes, and an anisotropic etching process (not illustrated) is performed for anisotropically etching the spacer forming material layer (not illustrated) such that sidewall spacers covering sidewalls of the gate stacks 341, 343 and 351, 353 are formed. After formation of a gate cap, the spacer structure 345 and 355 (illustrated in FIG. 3f) are obtained.

Figure 3G:
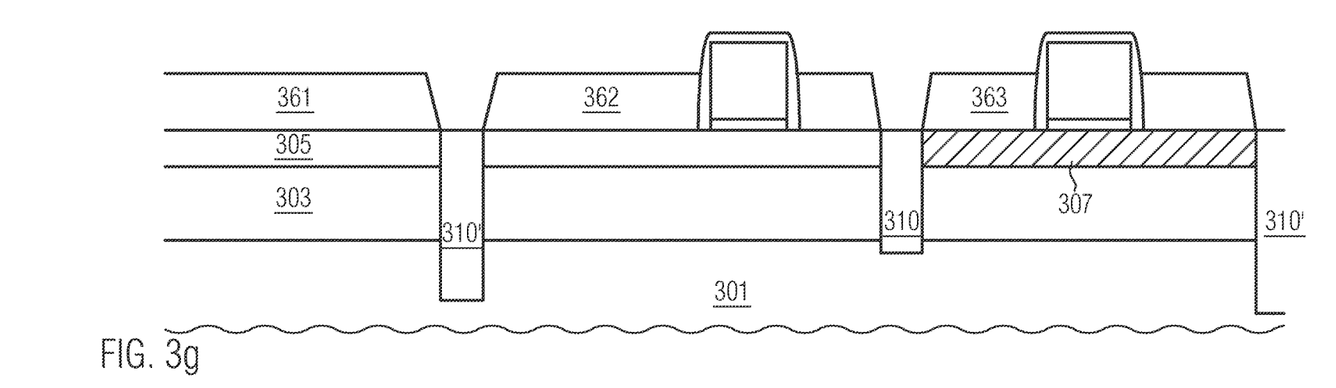

FIG. 3g schematically illustrates the semiconductor device structure at a more advanced stage during fabrication, particularly after a semiconductor material is grown on exposed surfaces of the active semiconductor material layer 305 and 307, respectively, such that a grown semiconductor material 361 is formed on the active semiconductor material layer 305 in the SOI region A, and raised source/drain regions 362, 363 are provided adjacent to the gate structures 340, 350 in the SOI regions B, C. The grown material 361 is optional and may be omitted in alternative embodiments of the present disclosure.

Figure 3H:
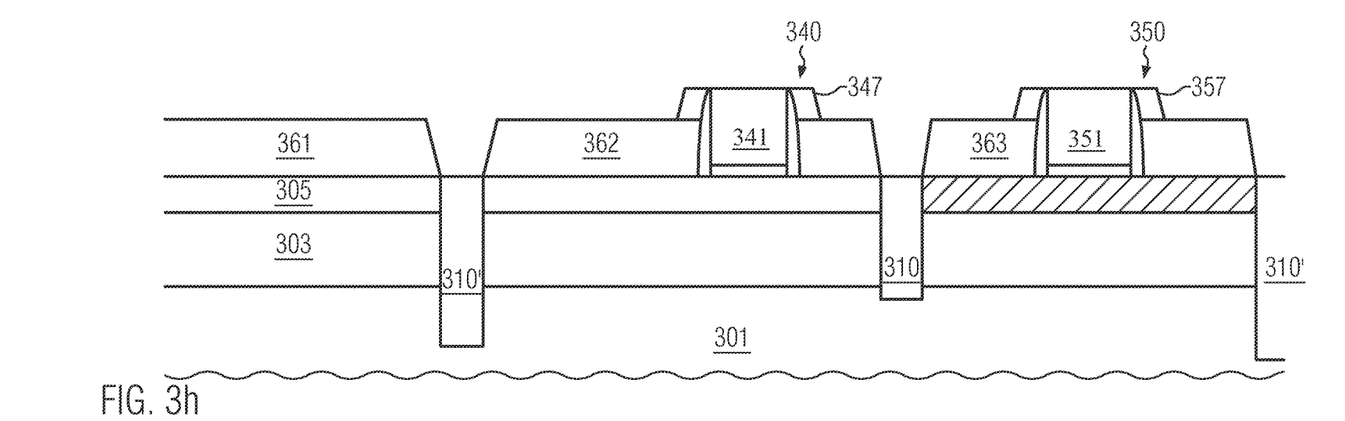

FIG. 3h schematically illustrates the semiconductor device structure at a more advanced stage during fabrication, particularly after a sidewall spacer extension structure 347, 357 is formed at an upper portion of the gate structures 340, 350, which upper portion is not covered by the raised source/drain regions 362, 363, and after the gate cap is removed to expose an upper surface of the gate electrode materials 341, 351 of the gate structures 340, 350.

In accordance with some illustrative embodiments of the present disclosure, one of an oxide material and a nitride material may be deposited over the semiconductor device structure and anisotropically etched in accordance with spacer etching techniques to form the sidewall spacer extension structures 347, 357 and to expose an upper surface of the gate electrode material 341, 351. In accordance with some special illustrative examples herein, an etching process for opening the gate structures to expose upper surfaces of the gate electrode material 341, 351 may be performed, followed by the deposition of material for forming the sidewall spacer extension portions 347, 357.

Figure 3I:
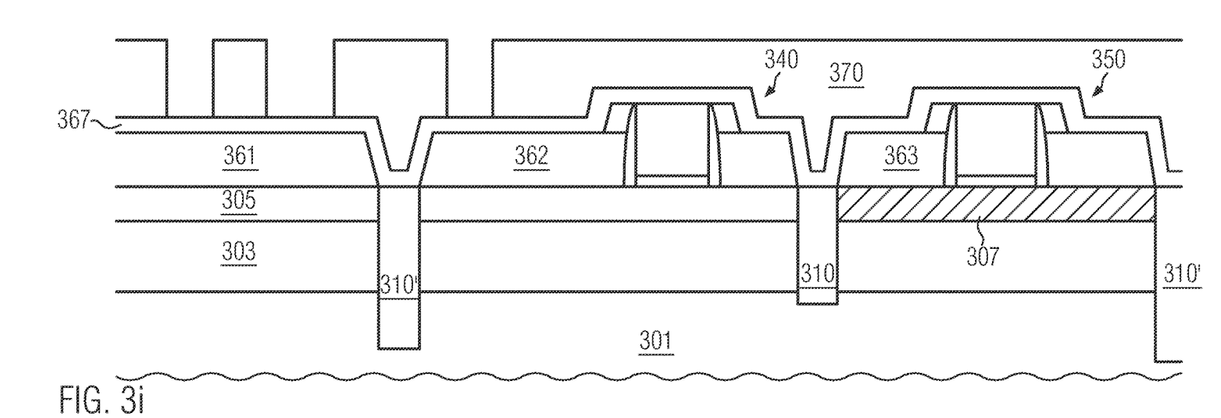

FIG. 3i schematically illustrates the semiconductor device structure at a more advanced stage during fabrication, particularly after an insulating material layer 367, e.g., one of an oxide material and a nitride material, is deposited, followed by the formation of a pattern mask structure 370 covering the SOI region C and partially covering the SOI regions A and B.

Figure 3J:
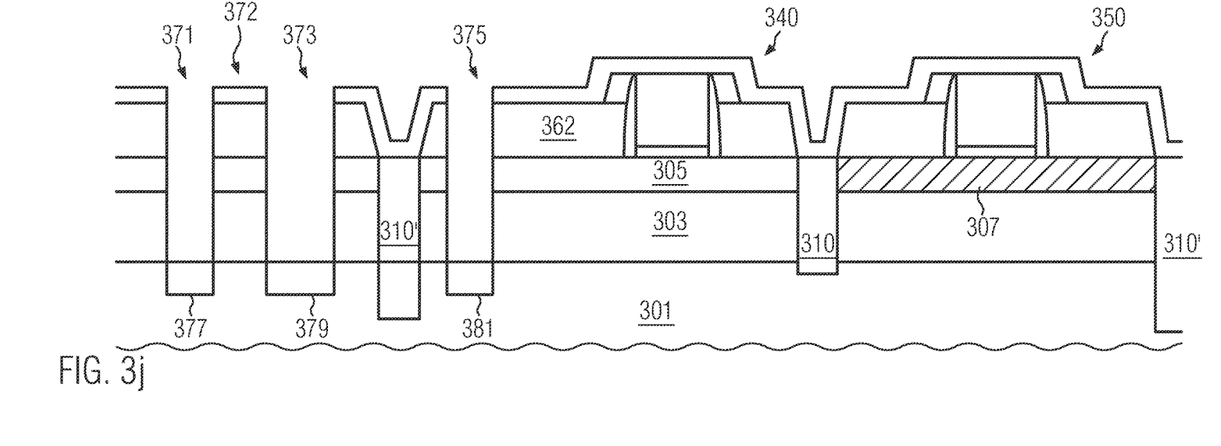

FIG. 3j schematically illustrates the semiconductor device structure at a more advanced stage during fabrication, particularly after an etching process through the masking pattern 370 is completed and the masking pattern 370 is removed. As a result of the etching process, trenches 371, 373 are formed in the SOI region A, the trenches 371 and 373 being separated by an SOI portion 372 and the trenches 371, 373 partially exposing an upper surface of the base substrate material 301 in the SOI region A.

Furthermore, a trench 375 is formed in the SOI region B at one side of the gate structure 340, the trench 375 partially exposing an upper surface of the base substrate material in the SOI region B. The person skilled in the art will appreciate that a distance between the trench 375 and the gate structure 340 is adjusted such that there is still enough landing space for a contact to the raised source/drain region 362 in between the trench 375 and the gate structure 340. After the trenches 371, 373 and 375 are formed, an implantation process may be performed in order to form bulk well regions 377, 379 and 381 in the base substrate material 301 at the bottom of the trenches 371, 373 and 375.

In accordance with some illustrative embodiments of the present disclosure, one of the wells 377 and 379, together with the bulk well region 381, is doped with dopants of the same conductivity type as the surrounding base substrate material. The other of the bulk well regions 377, 379 are doped with dopants of an opposite conductivity type to the surrounding conductivity of the base substrate material. For example, if the surrounding base substrate material is lightly P-doped, one of the bulk well regions 377 and 379, e.g., the bulk well region 379, together with the bulk well region 381 may be strongly P-doped, while the other of the bulk well regions 377, 379, e.g., the bulk well region 377, may be strongly N-doped. The person skilled in the art will appreciate that this does not pose any limitations on the present disclosure and other conductivity types and/or configurations may be applied. However, when using bulk well regions 377 and 379 of opposite conductivity types, a diode structure may be provided when contacting the bulk well regions 377 and 379 in the SOI region A.

Figure 3K:
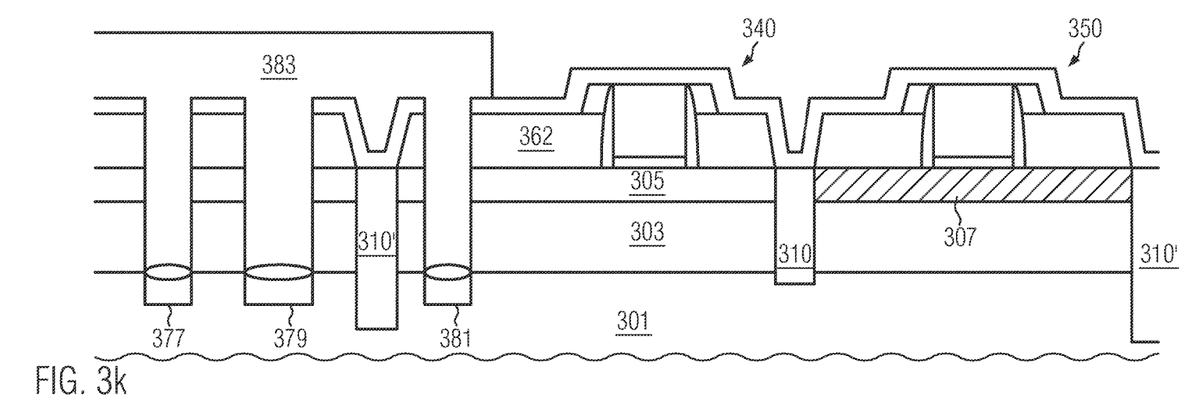
Figure 3L:
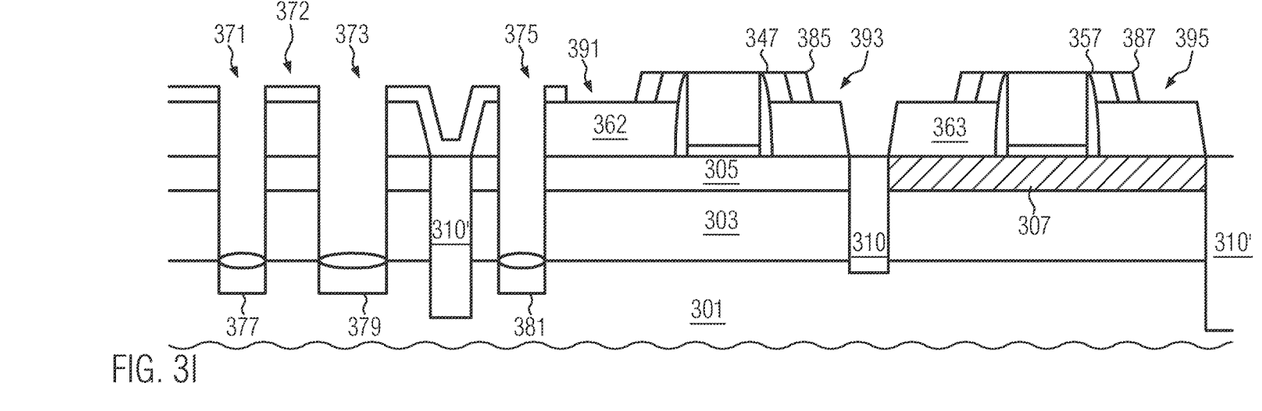

FIG. 3k schematically illustrates the semiconductor device structure at a more advanced stage during fabrication, particularly after the trenches 371, 373 and 375 in the SOI regions A and B are covered by a masking structure 383, while the remaining portion of the SOI region B and the SOI region C are exposed to further processing. Upon exposing the semiconductor device structure as illustrated in FIG. 3k to an anisotropic etching process, the semiconductor device structure as illustrated in FIG. 3l is obtained after the anisotropic etching process is completed and the masking pattern 383 is removed. With regard to FIG. 3l, upper surface regions 391, 393 and 395 of the raised source/drain regions 362, 363 are exposed and a separation between the upper surface regions 391, 393 and 395 to the gate structures 340, 350 is further adjusted by further additional spacer elements 385 and 387.

Figure 3M:
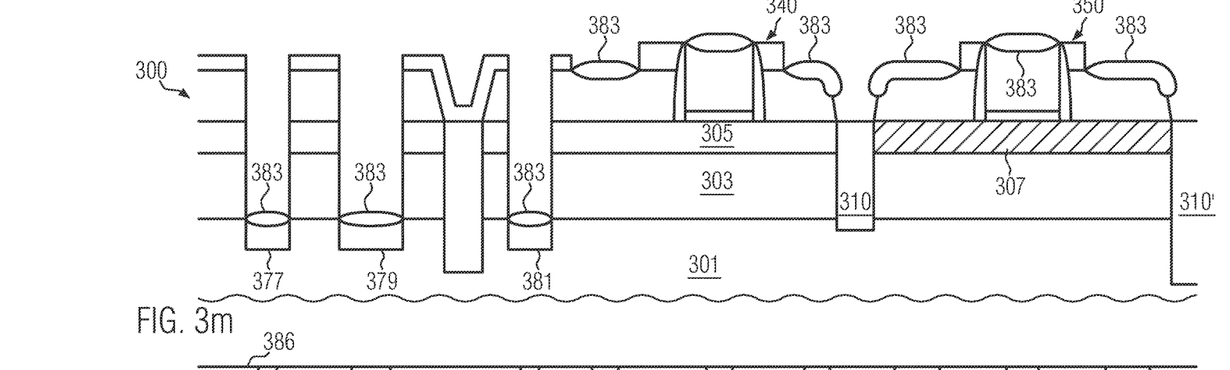

With regard to FIG. 3m, the semiconductor device structure is schematically illustrated at a more advanced stage during fabrication, particularly after a silicidation process is performed for forming silicide regions 383 which are formed at the bottom of the trenches 371, 373 and 375 and on the upper surface regions of the raised source/drain region 362, 363 and exposed upper surfaces of the gate electrode material 341, 351. Silicidation processes are well known in the art and comprise depositing a metal material, subjecting the metal material to an annealing step for forming silicide material and removing the un-reacted metal by known etch chemistries.

Figure 3N:
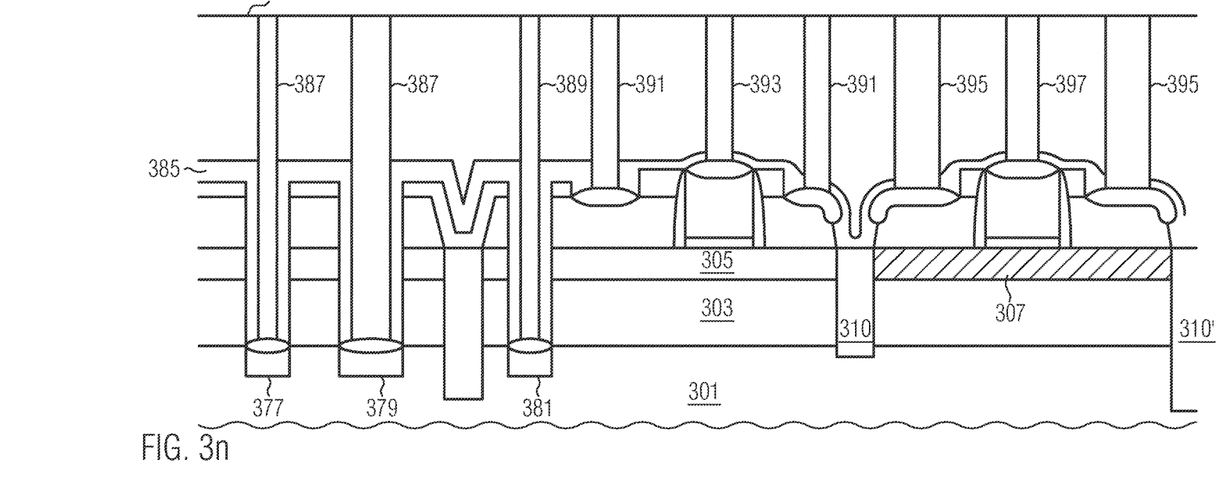

With regard to FIG. 3n, the semiconductor device structure is schematically illustrated at a more advanced stage during fabrication, particularly after a plasma-enhanced nitride (PEN) material 385, e.g., TPEN/CPEN (tensile PEN/compressive PEN), a contact dielectric 386 and contact structures 387, 389, 391, 393, 395 and 397 are formed. The contact structure 387 comprises two contacts contacting the silicide region 383 on the bulk well regions 377, 379 in the SOI region A for providing a diode structure between the contacts 387.

The contact structure 389 contacts the silicide region 383 on the bulk well region 381 for providing a back bias contact to the gate structure 340 in the SOI structure B. The contacts 391 represent source/drain contacts, while the contact 393 contacts the gate structure 340. With regard to the SOI region C, the contact 395 is a source/drain contact, while the contact 397 is contacting the gate structure 350. The contact structures may comprise contact liners, e.g., TiN, and contact material, such as tungsten.

The semiconductor device structure as fabricated in accordance with the process described above with regard to FIGS. 3a-3n provides PEN liners that allow for contact self-alignment in contact holes. Furthermore, no epi re-growth of BULEX material is performed. Therefore, issues as discussed above with regard to FIGS. 1a-1d are not arising. Of course, if desired, standard BULEX (before gate) may be used on the same chip for making other passive devices like resistors, DCAPs, etc.

Although raised source/drain regions are described above in the various illustrative embodiments of the present disclosure, the raised source/drain regions are optional and may also be omitted.

As no complete exposure of bulk material is performed in a complete active region, e.g., one of the regions A, B and C, no topography issues as discussed above with regard to FIGS. 2a-2c arise.

In accordance with the present disclosure, a smaller distance between back bias contact and semiconductor device contacts are achieved. Furthermore, back bias bulk contact and the implementation of diode structures in the bulk are possible at the same time in some of the above described illustrative embodiments.

In summary, the present disclosure provides fabrication processes where gate patterning processes are performed and FDSOI MOSFET formation is applied before steps working on BULEX areas are employed. Particularly, STI/RX patterning, gate stack formation and gate stack patterning, spacer formation, formation of raised source/drain regions, spacer/implant steps and gate nitride cap removal is performed, before a BULEX area is patterned via an additional masking pattern. After a complete reading of the present application, a person skilled in the art will appreciate that appropriate N- and P-masks and implant steps may be subjected to the bulk structures in order to implement appropriate diode and back bias configurations. After the BULEX working steps, the fabrication process is continued by silicidation techniques, TPEN, CPEN deposition, contact formation and the like.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a semiconductor device, the method comprising:
   providing a silicon-on-insulator (SOI) substrate with an active semiconductor layer disposed on a buried insulating material layer, which is in turn formed on a base substrate material;
   forming a gate structure above said active semiconductor layer in an active region of said SOI substrate;
   forming a first opening in said active semiconductor layer and said buried insulating layer to partially expose said base substrate for forming a first bulk exposed region after said gate structure is formed; and
   forming a contact structure in said first opening for contacting said first bulk exposed region.

2. The method of claim 1, further comprising performing a well implantation process for implanting dopants into said first bulk exposed region for forming a first bulk well region prior to forming said contact structure.

3. The method of claim 2, the method further comprising:
forming a shallow trench isolation (STI) structure in said SOI substrate prior to forming said gate structure; and
forming a second opening in said active semiconductor layer and said buried insulating layer to partially expose said base substrate for forming a second bulk exposed region, wherein said first and second bulk exposed regions and said active region are separated by said STI structure.

4. The method of claim 3, wherein said first and second bulk exposed regions define a diode structure.

5. The method of claim 2, wherein said first bulk exposed region is provided in said active region, and the method further comprises forming a silicide contact in said first bulk well region, said silicide contact being subsequently contacted by said contact structure for forming a back bias contact for said gate structure.

6. The method of claim 5, further comprising forming raised source/drain (RSD) regions adjacent to said gate structure above said active region before exposing said base substrate, wherein said first opening is formed by etching a trench into said RSD regions at one side of said gate structure so as to expose said bulk substrate in said trench.

7. The method of claim 1, further comprising implanting germanium into said active semiconductor layer of said active region for forming a silicon-germanium (SiGe) region in said active semiconductor layer prior to forming said gate structure.

8. The method of claim 1, wherein forming said first opening comprises etching a trench into said active semiconductor layer and said buried insulating material layer.

9. The method of claim 8, wherein forming said contact structure comprises forming a plasma-enhanced nitride (PEN) liner in said trench and depositing a contact material in said trench in alignment with said PEN liner.

10. The method of claim 9, further comprising forming a silicide region in said bulk exposed region prior to forming said PEN liner.

11. A method of forming a semiconductor device, the method comprising:
providing a silicon-on-insulator (SOI) substrate with an active semiconductor layer disposed on a buried insulating material layer, which is in turn formed on a base substrate material;
forming a shallow trench isolation (STI) structure separating a first SOI region and a second SOI region;
forming a gate structure above said active semiconductor layer in said first SOI region;
partially exposing said bulk substrate in said first SOI region at one side of said gate structure and contacting said exposed bulk region in said first SOI region for forming a back bias contact for said gate structure in said first SOI region; and
forming a diode structure in said second SOI region after said gate structure is formed.

12. The method of claim 11, wherein forming said diode structure comprises etching a first trench and a second trench into said second SOI region, each trench exposing said base substrate such that a first bulk exposed region and a second bulk exposed region are formed in said second SOI region, implanting a first well region having a first conductivity type into said first bulk exposed region, implanting a second well region having a second conductivity type opposite said first conductivity type, and forming a contact structure contacting said bulk well regions.

13. The method of claim 11, further comprising forming a raised source/drain (RSD) region at both sides of said gate structure prior to forming said bulk exposed regions in said first and second SOI regions, and partially removing said RSD region at said one side of said gate structure when forming said exposed bulk region in said first region.

14. The method of claim 11, wherein partially removing said RSD region comprises etching a trench into said RSD region at said one side of said gate structure, followed by forming a plasma-enhanced nitride (PEN) liner in said trench and depositing a contact material in said trench in alignment with said PEN liner for forming a back bias contact in said trench.

15. The method of claim 11, further comprising implanting germanium into said active semiconductor layer of said first SOI region prior to forming said gate structure.

16. A method of forming a semiconductor device, the method comprising:
providing a silicon-on-insulator (SOI) substrate with an active semiconductor layer disposed on a buried insulating material layer, which is in turn formed on a base substrate material;
forming a shallow trench isolation (STI) structure separating a first SOI region and a second SOI region;
forming a gate structure above said active semiconductor layer in said first SOI region;
forming a raised source/drain (RSD) region at both sides of said gate structure on said first SOI region;
partially removing said RSD region on one side of said gate structure when forming said exposed bulk region in said first region; and
partially exposing said bulk substrate in said first SOI region at said one side of said gate structure after partially removing said RSD region and contacting said exposed bulk region in said first SOI region for forming a back bias contact for said gate structure in said first SOI region.

17. The method of claim 16, wherein partially removing said RSD region comprises etching a trench into said RSD region at said one side of said gate structure, followed by forming a plasma-enhanced nitride (PEN) liner in said trench and depositing a contact material in said trench in alignment with said PEN liner for forming a back bias contact in said trench.

18. The method of claim 16, wherein a diode structure is formed in said second SOI region by etching a first trench and a second trench into said second SOI region, each trench exposing said base substrate such that a first bulk exposed region and a second bulk exposed region are provided in said second SOI region, implanting well regions into said first and second bulk exposed regions for forming bulk well regions having opposite conductivity types, and forming a contact structure contacting said bulk well regions.

* * * * *